US009136370B2

(12) United States Patent
Lui et al.

(10) Patent No.: US 9,136,370 B2
(45) Date of Patent: Sep. 15, 2015

(54) SHIELDED GATE TRENCH MOSFET PACKAGE

(71) Applicant: Alpha and Omega Semiconductor Incorporated, Sunnyvale, CA (US)

(72) Inventors: Sik Lui, Sunnyvale, CA (US); Yi Su, Cupertino, CA (US); Daniel Ng, Campbell, CA (US); Daniel Calafut, San Jose, CA (US); Anup Bhalla, Santa Clara, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 14/294,520

(22) Filed: Jun. 3, 2014

(65) Prior Publication Data
US 2014/0264571 A1    Sep. 18, 2014

Related U.S. Application Data

(62) Division of application No. 13/212,940, filed on Aug. 18, 2011, now Pat. No. 8,829,603.

(51) Int. Cl.
*H01L 29/78* (2006.01)
*H01L 29/40* (2006.01)
(Continued)

(52) U.S. Cl.
CPC .......... *H01L 29/7803* (2013.01); *H01L 23/647* (2013.01); *H01L 29/407* (2013.01);
(Continued)

(58) Field of Classification Search
CPC ..... H01L 29/78; H01L 21/336; H01L 29/407; H01L 23/647; H01L 29/7803; H01L 29/7813; H01L 24/06; H01L 24/49; H01L 24/48; H01L 29/4283

USPC .......... 257/329–331, 409, E21.418, E21.419, 257/E29.027, E29.262, E21.41
See application file for complete search history.

(56) References Cited

U.S. PATENT DOCUMENTS 5,434,435 A   7/1995 Baliga
5,998,833 A   12/1999 Baliga
(Continued)

FOREIGN PATENT DOCUMENTS

CN   100514672     7/2009
TW   201034195 A   9/2010

OTHER PUBLICATIONS

Final Office Action for U.S. Appl. No. 13/212,940, dated Mar. 10, 2014.
(Continued)

*Primary Examiner* — Selim Ahmed
(74) *Attorney, Agent, or Firm* — Joshua D. Isenberg; JDI Patent

(57) ABSTRACT

A trench formed in a body layer and epitaxial layer of a substrate is lined with a dielectric layer. A shield electrode formed within a lower portion of the trench is insulated by the dielectric layer. A gate electrode formed in the trench above the shield electrode is insulated from the shield electrode by another dielectric layer. One or more source regions formed within the body layer is adjacent a sidewall of the trench. A source pad formed above the body layer is electrically connected to the source regions and insulated from the gate electrode and shield electrode. The source pad provides an external contact to the source region. A gate pad provides an external contact to the gate electrode. A shield electrode pad provides an external contact to the shield electrode. A resistive element is electrically connected between the shield electrode pad and a source lead.

17 Claims, 15 Drawing Sheets

(51) Int. Cl.
  *H01L 29/66* (2006.01)
  *H01L 23/64* (2006.01)
  H01L 29/423 (2006.01)
  H01L 23/00 (2006.01)

(52) U.S. Cl.
  CPC ...... *H01L29/66734* (2013.01); *H01L 29/7813* (2013.01); *H01L 24/06* (2013.01); *H01L 24/48* (2013.01); *H01L 24/49* (2013.01); *H01L 29/4238* (2013.01); *H01L 29/42368* (2013.01); *H01L 2224/0603* (2013.01); *H01L 2224/4813* (2013.01); *H01L 2224/48247* (2013.01); *H01L 2224/4911* (2013.01); *H01L 2224/49111* (2013.01); *H01L 2924/10253* (2013.01); *H01L 2924/12032* (2013.01); *H01L 2924/13091* (2013.01); *H01L 2924/3025* (2013.01)

(56) References Cited

U.S. PATENT DOCUMENTS

| | | | |
|---|---|---|---|
| 6,100,577 | A | 8/2000 | Linliu |
| 6,690,062 | B2 | 2/2004 | Henninger et al. |
| 6,750,116 | B1 | 6/2004 | Chen |
| 7,470,588 | B2 | 12/2008 | Cho et al. |
| 7,473,603 | B2 | 1/2009 | Kraft et al. |
| 7,576,388 | B1 | 8/2009 | Wilson et al. |
| 7,701,002 | B2 | 4/2010 | Seo et al. |
| 7,768,064 | B2 | 8/2010 | Sapp et al. |
| 7,772,642 | B2 | 8/2010 | Marchant |
| 7,915,672 | B2 | 3/2011 | Venkatraman |
| 7,935,577 | B2 | 5/2011 | Grebs et al. |
| 8,187,939 | B2 | 5/2012 | Tai et al. |
| 8,193,580 | B2 | 6/2012 | Chen et al. |
| 8,193,581 | B2 | 6/2012 | Yedinak et al. |
| 8,236,651 | B2 | 8/2012 | Chen et al. |
| 8,431,457 | B2 | 4/2013 | Chang et al. |
| 2004/0065919 | A1 | 4/2004 | Wilson et al. |
| 2004/0185622 | A1 | 9/2004 | Williams et al. |
| 2006/0049455 | A1 | 3/2006 | Jang et al. |
| 2006/0273382 | A1 | 12/2006 | Hshieh |
| 2007/0155104 | A1 | 7/2007 | Marchant et al. |
| 2007/0194374 | A1 | 8/2007 | Bhalla et al. |
| 2008/0121986 | A1 | 5/2008 | Hshieh |
| 2008/0135931 | A1 | 6/2008 | Challa et al. |
| 2008/0258213 | A1 | 10/2008 | Yilmaz et al. |
| 2008/0265289 | A1 | 10/2008 | Bhalla |
| 2009/0008709 | A1 | 1/2009 | Yedinak et al. |
| 2009/0014768 | A1 | 1/2009 | Lin et al. |
| 2009/0020810 | A1 | 1/2009 | Marchant |
| 2009/0072301 | A1 | 3/2009 | Bhalla et al. |
| 2009/0085074 | A1 | 4/2009 | Su et al. |
| 2009/0111231 | A1 | 4/2009 | Grebs et al. |
| 2009/0114968 | A1 | 5/2009 | Wang et al. |
| 2010/0038708 | A1 | 2/2010 | Yilmaz et al. |
| 2010/0052044 | A1 | 3/2010 | Hirler |
| 2010/0065904 | A1 | 3/2010 | Pan et al. |
| 2010/0102871 | A1 | 4/2010 | Werner |
| 2010/0140697 | A1 | 6/2010 | Yedinak et al. |
| 2010/0289075 | A1 | 11/2010 | Lin et al. |
| 2011/0018059 | A1* | 1/2011 | Dunn et al. ................. 257/334 |
| 2011/0037120 | A1 | 2/2011 | Chen |
| 2011/0049618 | A1 | 3/2011 | Lee et al. |
| 2011/0068386 | A1 | 3/2011 | Tai et al. |
| 2011/0127602 | A1 | 6/2011 | Mallikarjunaswamy |
| 2011/0133258 | A1 | 6/2011 | Chen |
| 2011/0212586 | A1 | 9/2011 | Grebs et al. |
| 2011/0244641 | A1 | 10/2011 | Pan et al. |
| 2011/0254086 | A1 | 10/2011 | Hsieh |
| 2011/0303975 | A1 | 12/2011 | Yilmaz et al. |
| 2011/0312138 | A1 | 12/2011 | Yedinak et al. |
| 2012/0058615 | A1 | 3/2012 | Marchant et al. |
| 2012/0098059 | A1 | 4/2012 | Tai et al. |
| 2012/0129328 | A1 | 5/2012 | Chang et al. |
| 2012/0142155 | A1 | 6/2012 | Murphy et al. |
| 2012/0187472 | A1 | 7/2012 | Chang et al. |
| 2012/0187474 | A1 | 7/2012 | Rexer et al. |
| 2013/0043527 | A1 | 2/2013 | Lui et al. |

OTHER PUBLICATIONS

Non-Final Office Action for U.S. Appl. No. 13/212,940, dated Oct. 28, 2013.
Notice of Allowance for U.S. Appl. No. 13/212,940, dated May 22, 2014.
Taiwan Office Action for TW Application No., dated Dec. 18, 2014.

\* cited by examiner

SHIELDED GATE TRENCH MOSFET PACKAGE

PRIORITY CLAIM

This application is a divisional application of and claims the benefit of priority of commonly assigned U.S. patent application Ser. No. 13/212,940, filed Aug. 18, 2011, the entire disclosures of which are incorporated herein by reference.

FIELD OF THE INVENTION

This invention relates in general to semiconductor power field effect transistor packages and in particular shielded gate trench MOSFET packages with improved reverse recovery current.

BACKGROUND OF THE INVENTIONS

Shielded gate trench MOSFETs are preferred for certain applications over conventional MOSFETs and conventional trench MOSFETs because they provide several advantageous characteristics. Shielded gate trench MOSFETs exhibit reduced gate-to-drain capacitance $C_{gd}$, reduced on-resistance $R_{DSon}$, and increased breakdown voltage of the transistor. For conventional trench MOSFETs, the placement of many trenches in a channel, while decreasing the on-resistance, also increased the overall gate-to-drain capacitance. The introduction of the shielded gate trench MOSFET structure remedies this issue by shielding the gate from the electric field in the drift region, thereby substantially reducing the gate-to-drain capacitance. The shielded gate trench MOSFET structure also provides the added benefit of higher minority carrier concentration in the drift region for the device's breakdown voltage and hence lower on-resistance.

The improved performance characteristics of the shielded gate trench MOSFET make the technology an excellent choice for power switching applications such as the switching converter commonly referred to as a synchronous buck converter (DC-DC converter). The shielded gate trench MOSFET is particularly suitable for the high-side switch in a synchronous buck converter. However, for the low-side switch which operates as a synchronous rectifier, excessive charge during the reverse recovery of the body diode results in increased power dissipation and reduced converter efficiency.

It is within this context that embodiments of the present invention arise.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Figure 1:
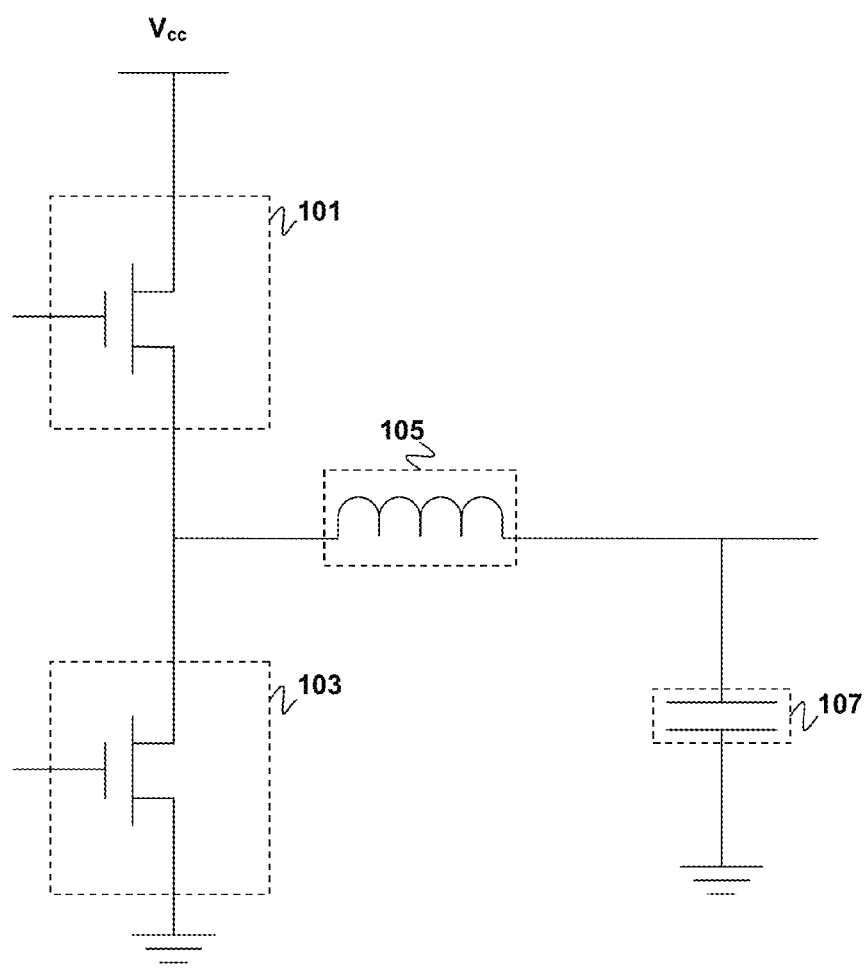
FIG. 1 is a circuit diagram illustrating a DC-DC buck converter.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

For convenience, use of + or − after a designation of conductivity or charge carrier type (p or n) refers generally to a relative degree of concentration of designated type of charge carriers within a semiconductor material. In general terms an n+ material has a higher negative charge carrier (e.g., electron) concentration than an n material and an n material has a higher carrier concentration than an n− material. Similarly, a p+ material has a higher positive charge carrier (e.g., hole) concentration than a p material and a p material has a higher concentration than a p− material. It is noted that what is relevant is the concentration of charge carriers, not necessarily dopants. For example, a material may be heavily doped with n-type dopants but still have a relatively low charge carrier concentration if the material is also sufficiently counter-doped with p-type dopants. As used herein, a concentration of dopants less than about $10^{16}/cm^3$ may be regarded as "lightly doped" and a concentration of dopants greater than about $10^{17}/cm^3$ may be regarded as "heavily doped".

INTRODUCTION

When a MOSFET device's body diode is forward biased, minority carrier charge is formed within the drift region to allow for current to flow between the source region and drain region. Diode reverse recovery refers to the process whereby the minority carrier charge stored in the drift region is removed so that the MOSFET device's body diode can be switched from forward bias to reverse bias. For shielded gate trench MOSFETs, the reverse recovery behavior may be significantly attributed to the displacement current in the shield electrode. The displacement current is a product of the capacitor formed between the shield electrode and the drift region. The magnitude of charge associated with the shield displacement current can be comparable to that of the charge expected from the diode's recovery current alone. As such, the use of an integrated Schottky diode would provide little improvement in MOSFET reverse recovery behavior since any reduction in the total reverse recovery charge would be offset by the shield electrode's contribution to this charge. Embodiments of the present invention solve the problem described above, while at the same time providing a MOSFET device flexible enough to serve as both a high-side switch and low-side switch in a synchronous buck converter.

FIG. 1 illustrates a circuit schematic diagram of a synchronous buck converter 100. The buck converter 100 includes a high-side switch 101 and a low-side switch 103, both of which are implemented as MOSFET devices. The high-side switch 101 is connected between a voltage source $V_{cc}$, and an inductor 105. The low-side switch 103 is connected between the inductor 105 and the ground. The switching behavior of the high-side switch 101 and the low-side switch 103 are driven by voltages applied to their respective gate electrodes.

As discussed above, an increase in the reverse recovery current impairs the performance of the low-side switch 103 reducing the efficiency of the buck converter 100. During a switch cycle of the buck converter 100, the low-side switch 103 is turned on while high-side switch 101 is turned off. After the low-side switch 103 turns off, but before the high-side switch 101 turns on, a time delay must occur in order to ensure that cross conduction does not occur. The time during which both the low-side switch 103 and high-side switch 101 are off is known as "dead-time" and functions to minimize losses caused by cross conduction. The low-side MOSFET's body diode is forward biased during the dead-time. An increase in the reverse recovery current (e.g., displacement current) at the low side switch 103 increases the recovery time needed for the low-side switch 103 to return to its non-conducting state. As a result of the increased recovery current, when the high-side switch 101 is turned on at the end of the dead-time, the excess recovery charge at the low-side switch 103 is fed back to the high-side switch 101 causing energy loss.

Figure 2:
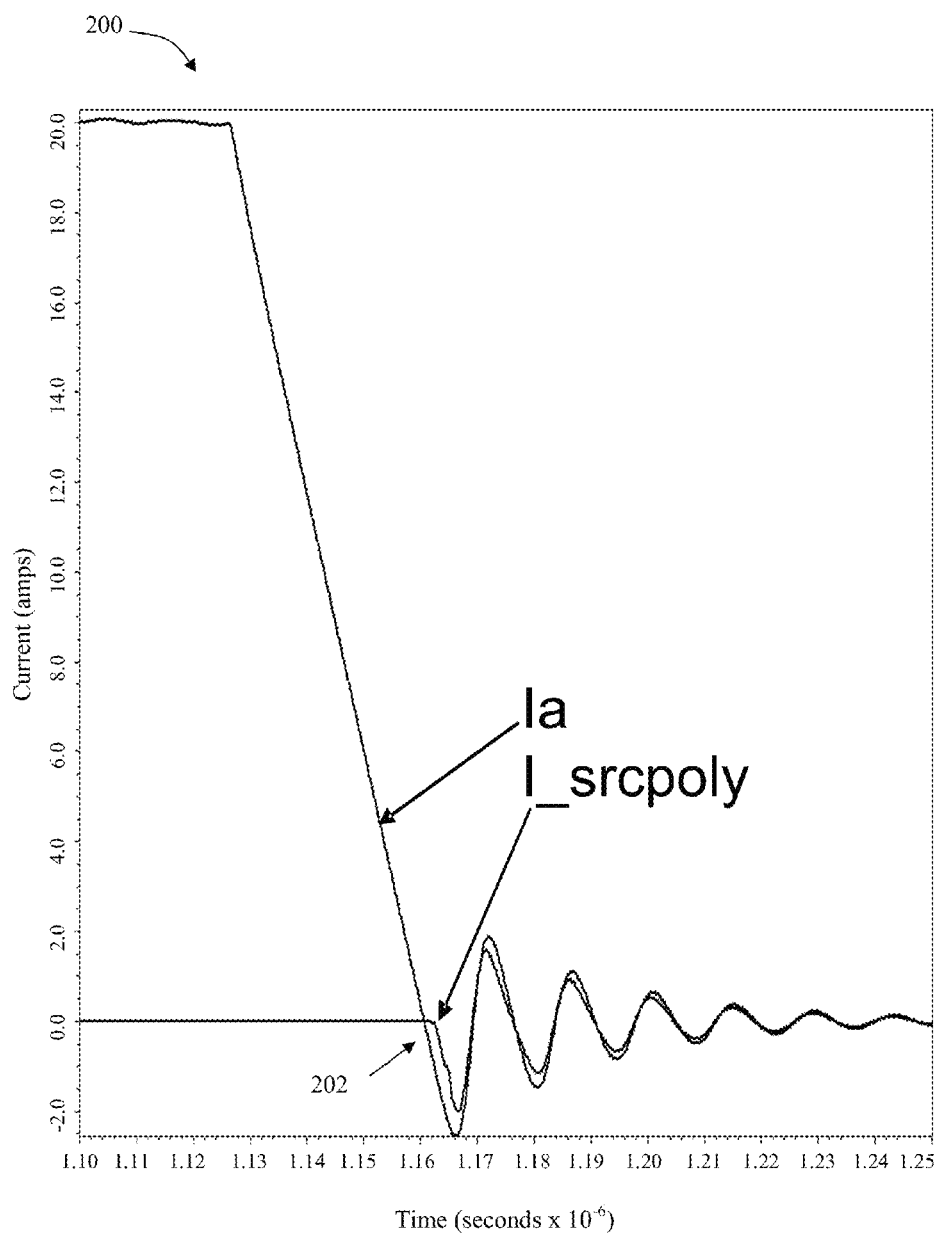
FIG. 2 is a diagram illustrating the reverse recovery behavior of the DC-DC buck converter in FIG. 1.

A simulation of the reverse recovery of an exemplary shielded gate trench MOSFET is provided in FIG. 2. The current versus time graph 200 shows that the reverse recovery current 202 starts at around 1.16 microseconds ($1.16 \times 10^{-6}$). In returning the shielded gate trench MOSFET to its non-conducting state, the MOSFET undergoes a phenomenon known as phase node voltage overshoot/ringing. This leads to the MOSFET device current undergoing multiple oscillations before reaching its non-conducting state. As the shielded gate trench MOSFET goes from forward to reverse bias, the voltage transition in the drift region produces a displacement current in the capacitor formed by the shield electrode. This displacement current introduced by the shield electrode contributes to the total current during reverse recovery because the shield is connected to the source. The displacement current may contribute to over 50% of the total reverse recovery current. As such, it is desirable to modify a shielded gate trench MOSFET to reduce the magnitude of displacement current, thereby significantly improving the reverse recovery behavior of a buck converter.

Figure 3:
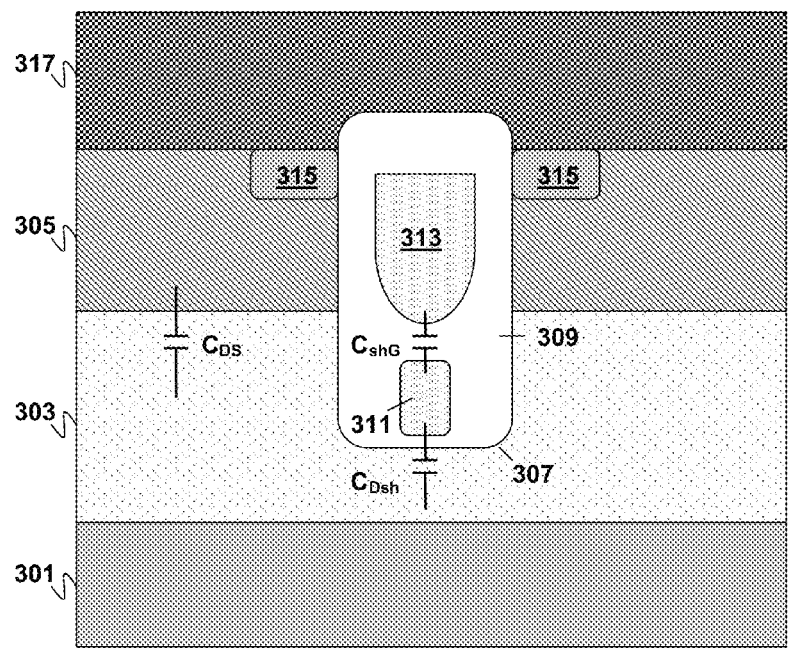
FIG. 3 is a cross-sectional schematic diagram illustrating a shielded gate trench MOSFET with capacitor elements representing sources of parasitic capacitance.

The sources of relevant parasitic capacitance are illustrated in FIG. 3. FIG. 3 illustrates a cross-sectional schematic diagram of a shielded gate trench MOSFET. As with all the other figures described herein, the relative dimensions and sizes of the elements shown do not reflect actual dimensions and are for illustrative purposes only.

The shielded gate trench MOSFET 300 comprises an n+ type substrate 301 such as silicon, which acts as the drain of the MOSFET 300. An n-type epitaxial region 303, also known as a drift region, is attached to the substrate 301. The epitaxial region and substrate may be doped with any suitable n-type dopant species (ions or atoms), such as phosphorous. A p-type body region 305 is attached to the drift region 303, forming the body of the MOSFET 300. The body region may be doped with any suitable p-type dopant species, such as boron.

A trench 307 is formed within the body region 305 and drift/epitaxial region 303. The trench 307 is lined with dielectric material 309 such as silicon oxide. A shield electrode 311 composed of polysilicon is deposited within the trench 307. A gate electrode 313 also composed of polysilicon is deposited within the trench 307. The gate electrode 313 and shield electrode 311 are insulated from adjacent regions and also from each other by dielectric material 309 such as silicon oxide.

A pair of n+ source regions 315 area formed within a top layer of the body region 305. Metal pad 317 serves as the source pad and provides an external connection to the source regions 315 of the shielded gate trench MOSFET device 300. The source pad 317 is insulated from the gate electrode 313 and shield electrode 311. When a positive voltage is applied to the gate electrode 313, the MOSFET device 300 turns on and a conducting channel is formed vertically within the body region 305 between the source 315 and the drift/epitaxial region 303 along the walls of the trench 307.

The total parasitic capacitance of the MOSFET 300 may be attributed to three components: the drift region capacitance $C_{DS}$ between the drain and the source, the overlap capacitance $C_{Dsh}$ between the drain and the shield, and the overlap capacitance $C_{shG}$ between the shield and the gate. The shield electrode 311 shields the gate electrode 313 from having any substantial overlap with the drift/epitaxial region 303, thereby significantly reducing the gate-to-drain overlap capacitance.

As discussed above with respect to FIG. 2, the displacement current (i.e., dominant source of reverse recovery current) is caused by the storage of charge at the capacitor formed by the shield electrode 311 due to the drain-shield capacitance. Thus, by reducing the displacement current at the shield electrode, the phase node voltage overshooting/ringing phenomenon that occurs during switching of MOSFET devices may be effectively reduced.

Prior art devices have attempted to reduce the displacement current at the shield electrode by introducing a resistor within the MOSFET between the shield electrode and source electrode. Adding a resistive element to the connection between the shield and the source causes the shield displacement current to be reduced when the drain voltage transitions to its static condition during a switching event. The resistive element together with the shield electrode capacitor works as a snubber circuit that damps the phase node oscillation/overshoot.

While prior art devices do effectively reduce displacement current, thereby improving reverse recovery behavior by diminishing the effect of phase node voltage overshooting/ringing, they do so on an application-by-application basis. Said otherwise, the prior art devices such as those implement an internal fixed resistive element between the shield electrode and the source with no flexibility for the resistive value. As such each particular shielded gate trench MOSFET device may be desirable for a certain application without being able to adapt to other applications.

Figure 4A:
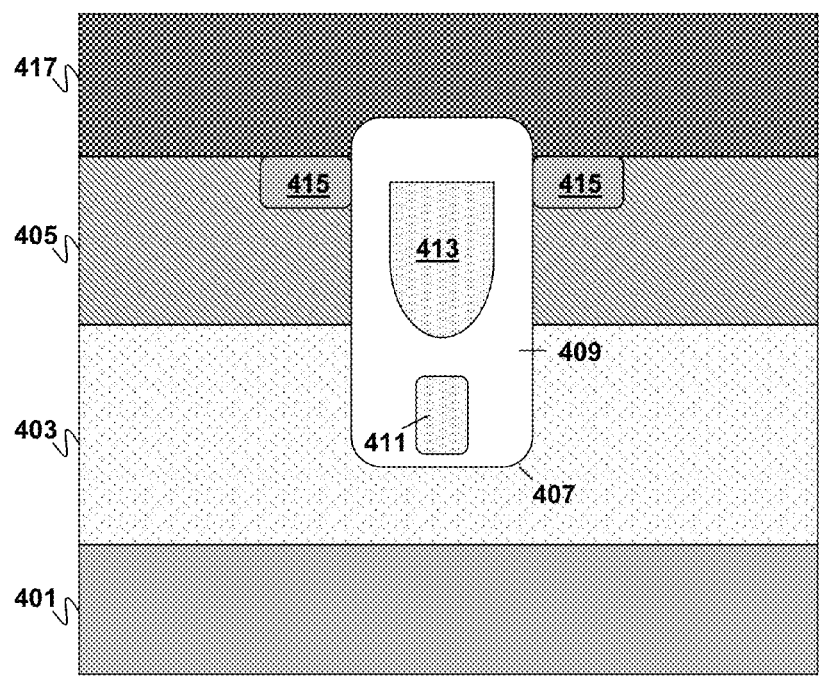
FIGS. 4A and 4B are cross-sectional and top-view schematic diagrams illustrating a shielded gate trench MOSFET in accordance with a preferred embodiment of the present invention.
Figure 4B:
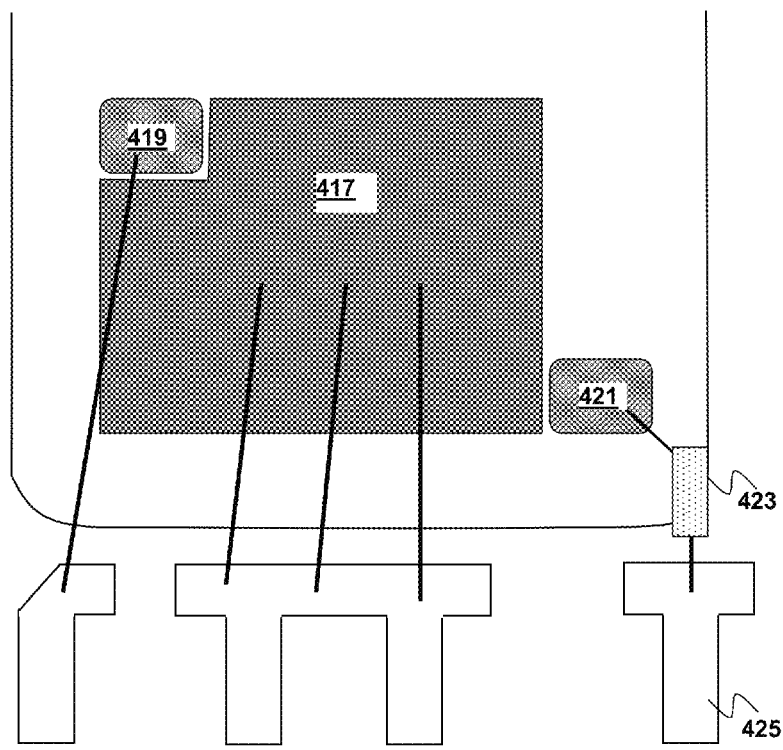

FIGS. 4A and 4B are cross-sectional and top-view schematic diagrams illustrating a shielded gate trench MOSFET device according to an embodiment of the present invention. The MOSFET device 400 begins with a substrate 401 of a first conductivity type. The substrate may be heavily doped with suitable dopant species. By way of example and not by way of limitation, the substrate may be an n+ substrate such as silicon. The substrate 401 acts as the drain of the shielded gate trench MOSFET device 400.

An epitaxial/drift layer 403 of a first conductivity type is then supported by the substrate 401. By way of example, and not by way of limitation, the epitaxial/drift layer 403 may be n-type. A body layer 405 of a second conductivity type is formed above the epitaxial/drift layer 403.

A trench 407 is then formed within the body layer 405 and the epitaxial/drift layer 403. The trench is lined with dielectric material 409 such as silicon oxide. A shield electrode 411 is formed within a bottom portion of the trench 407. By way of example, and not by way of limitation, the shield electrode 411 may be composed of polysilicon or any other conductive material. The shield electrode 411 is insulated from the epitaxial/drift layer 403 by the dielectric material 409 lining the trench 407. A gate electrode 413 is formed within the trench 407 above the shield electrode 411. The gate electrode 413 is insulated from the shield electrode 411 by dielectric material 409.

While the shield electrode 411 and gate electrode 413 are illustrated as being positioned at a particular location within the trench 407, it is important to note that the shield electrode 411 and gate electrode 413 may extend in a direction perpendicular to the plane of the cross-section in FIG. 4A, and may also extend vertically within the epitaxial/drift layer 403 and body layer 405 to facilitate the formation of external contacts.

A pair of source regions 415 are formed within the body layer 405 adjacent the sidewalls of the trench 415. The source regions may be heavily doped with dopants of the same conductivity type as the substrate 401 and the epitaxial/drift layer 403. By way of example, and not by way of limitation, these source regions 415 may be doped with n+ type for an n+ type substrate 401. As discussed above, the trench shield gate MOSFET device 400 behaves as follows: when a positive voltage is applied to the gate electrode 413, the MOSFET device 400 turns on and a conducting channel is formed vertically within the body region 405 between the source 415 and the drift/epitaxial region 403 along the walls of the trench 407.

Metal pads 417, 419, 421 are deposited above the body layer 405 to provide external contacts to the source regions 415, the gate electrode 413, and the shield electrode 411. Metal pad 417 serves as the source pad and provides an external connection to the source regions 415 of the shielded gate trench MOSFET device 400. The source pad 417 is insulated from the gate electrode 413 and shield electrode 411. Metal pad 419 serves as the gate pad and provides an electrical connection to the gate electrode 413. The gate pad 419 is insulated from the shield electrode 411 and source regions 415. Metal pad 421 serves as the shield pad and provides an electrical connection to the shield electrode 411. The shield pad 421 is insulated from the gate electrode 413 and source regions 415. As mentioned above, the gate electrode 413 and shield electrode 411 may extend in a direction perpendicular to the plane of the cross section in FIG. 4A and also in a vertical direction through the epitaxial/drift layer 403 and body layer 405 to form electrical connections with their respective metal pads 419, 421.

To alleviate the undesirable reverse recovery behavior of the shielded gate trench MOSFET device 400, an optional resistive element 423 may be connected externally between the shield pad 421 and the shield lead 425 of a lead frame in the package. The external resistive element 423 provides the same reverse recovery improvements as discussed above with respect to the fixed internal resistive element of the prior art devices. Namely, adding a resistive element 423 between the shield 411 and the source causes the shield displacement current to be impeded when the drain voltage transitions to its static condition during a switching event. The resistive element 423 enables the voltage on the shield electrode 411 to increase in response to a relatively small charge that develops on the capacitor across the shield dielectric 409 due to the increasing potential at the drain 401. The consequence of the induced potential on the shield electrode 411 is that the voltage at the shield electrode 411 changes with the voltage changes occurring in the epitaxial/drift layer 403, which reduces the differential voltage between the shield electrode 411 and the drain 401. Thus, the differential voltage at the drain-shield capacitor decreases, and the overall displacement current at the shield electrode 411 is reduced. The reduction of displacement current at the shield electrode helps minimize the phase node voltage overshooting/ringing that occurs in a DC-DC switching application.

By allowing the resistive element 423 to be connected externally to the shielded gate trench MOSFET device 400 rather than internally, the MOSFET device 400 lends itself to much more flexibility. For instance, the reverse recovery behavior of the MOSFET device 400 may be adjusted depending on the particular application. For an application that requires minimal phase node voltage overshooting/ringing, a resistive element 423 with a higher resistance value may be used. For an application where phase node voltage overshooting/ringing does not affect device performance, the shield pad 421 may be directly shorted to the source lead. This flexibility is particularly useful in the DC-DC buck converter application discussed above with respect to FIG. 1. In that particular application, the high-side switch 101 is minimally affected by the reverse recovery behavior of the MOSFET device, while the low-side switch 103 is heavily affected by the reverse recovery behavior of the MOSFET device. The same MOSFET device as that illustrated in FIGS. 4A and 4B may be used for both the high-side switch 101 and the low-side switch 103, with an additional external resistive element connected to the low-side switch 103 to minimize phase node voltage overshooting/ringing. Rather than having to design a different MOSFET device to fit each switch or different application, the invented shielded gate trench MOSFET allows for the same MOSFET device to be used for various applications by simply adjusting the external resistive element to fit the particular application.

The external resistive element 423 may be implemented in various ways. The resistive element 423 may be implemented as just a simple external resistor. The resistive element 423 may also be implemented as a metal layer. When the resistive element 423 is implemented as a metal layer, the resistivity is distributed throughout the entire metal layer. The resistive element 423 may also be implemented as a doped polysilicon layer. The resistivity of the doped polysilicon layer may be distributed throughout the entire doped polysilicon layer.

In addition to having an external resistive element 423 connected between the shield pad 421 and the shield lead 425, an internal resistive element (not shown) may also be implemented within the MOSFET device for use with certain applications. By way of example, and not by way of limitation, the polysilicon forming the gate electrode 413 may be used as a lumped resistor between the shield electrode 411 and the shield lead 425. Also by way of example, and not by way of limitation, the polysilicon forming the shield electrode 411 may also be used as a lumped resistor between the shield electrode 411 and the shield lead 425.

There are a number of different processes that may be used to fabricate a MOSFET device of the type illustrated in FIG.

4A and FIG. 4B and described above. By way of example, and not by way of limitation the process described in U.S. patent application Ser. No. 12/722,384, filed Mar. 11, 2010, which is incorporated herein by reference, may be adapted to fabrication of the type of device shown in FIG. 4A and FIG. 4B.

FIGS. 5A-5G illustrate a method for forming the shielded gate trench MOSFET device depicted in FIG. 4A and FIG. 4B. While the diagrams and description will refer only to the shielded gate trench MOSFET device depicted in FIG. 4A and FIG. 4B, one ordinarily skilled in the art will recognize that this fabrication method may be easily extended for any of the shielded gate trench MOSFET devices described above by including or omitting standard processing steps.

Figure 5A:
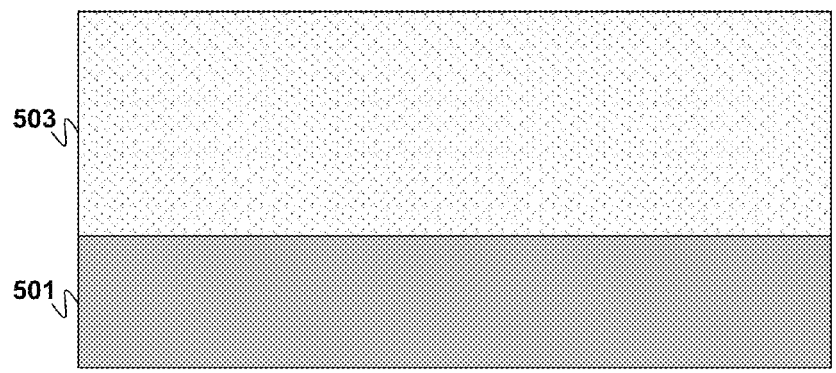
FIGS. 5A-H are cross-sectional view schematic diagrams illustrating a method for manufacturing a shielded gate trench MOSFET device according to an embodiment of the present invention.

Fabrication of a shielded gate trench MOSFET 500 begins with a substrate 501 of a first conductivity type which supports an epitaxial/drift layer 503 of the same conductivity type as the substrate 501 as illustrated in FIG. 5A. By way of example and not by way of limitation, the substrate 501 may be an n+ type substrate such as a silicon wafer. The epitaxial/drift layer 503 may be grown over the substrate 501 and may be an n type epitaxial/drift layer 503. The substrate 501 forms the drain of the MOSFET device 500.

Figure 5B:
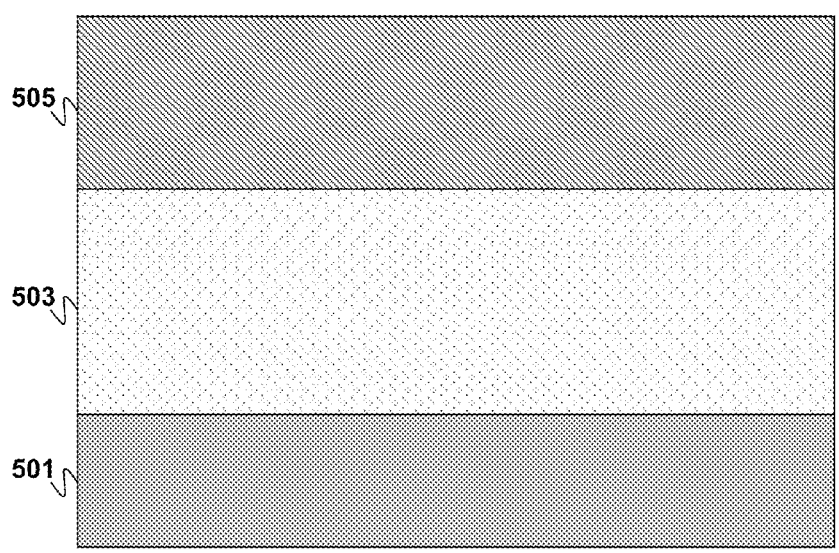

A body layer 505 of a second conductivity type may then be ion implanted on top of the epitaxial/drift layer 503 as illustrated in FIG. 5B. By way of example, the body layer 505 may be a p type body layer 505. The body layer 505 may be doped using ion implantation followed by diffusion to achieve the desired doping concentration. The body layer 505 operates as a conducting channel between the source of the MOSFET device and the drain of the MOSFET device when the device is turned on.

Figure 5C:
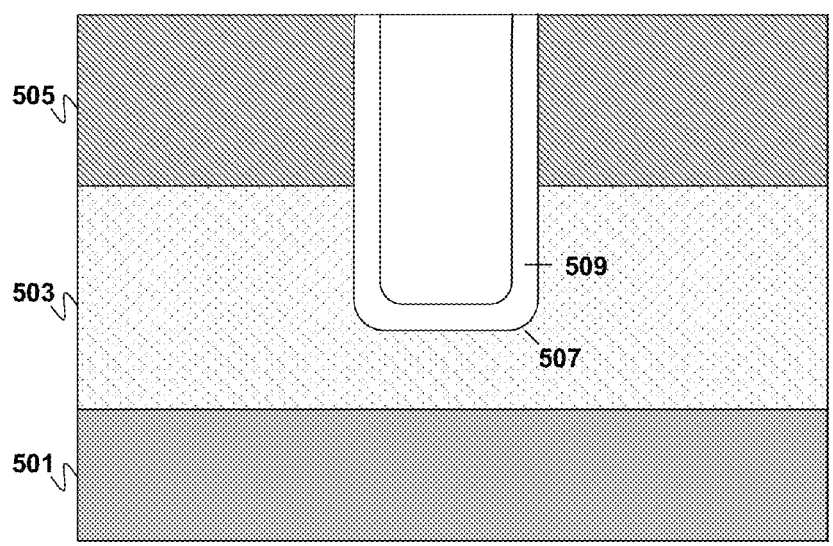

A trench 507 may then be formed within the body layer 505 and epitaxial/drift layer 503 as illustrated in FIG. 5C. The trench 507 may be etched using a hard mask (mask not shown) to a depth such that the bottom of the trench 507 is located within the epitaxial/drift layer 503. A dielectric layer 509 may then be deposited or grown along the walls of the trench 507.

Figure 5D:
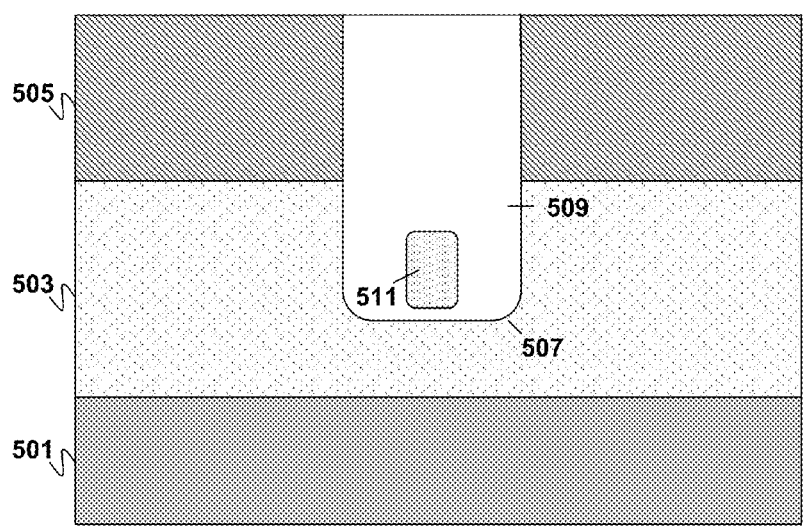

A shield electrode 511 may be formed within the trench 507 as illustrated in FIG. 5D. By way of example, and not by way of limitation, the shield electrode 511 may be composed of polysilicon or any other conducting material. While not illustrated, it is important to note that the shield electrode 511 may extend in a direction perpendicular to the plane of the cross-section in FIGS. 5A-5G, and may also extend vertically within the epitaxial/drift layer 503 and body layer 505 to facilitate the formation of external contacts.

Figure 5E:
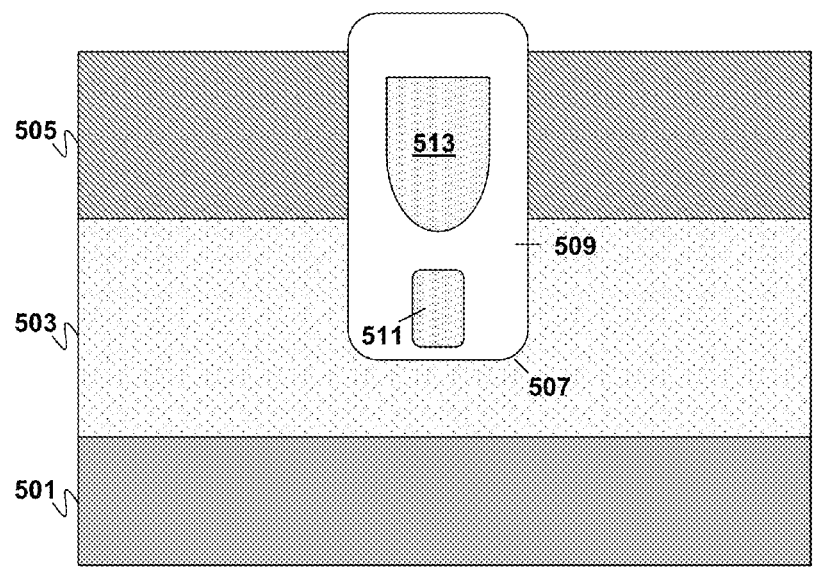

A gate electrode 513 may be formed within the trench 507 with a dielectric layer 509 insulating the gate electrode 513 from the shield electrode 511 as illustrated in FIG. 5E. By way of example, and not by way of limitation, the gate electrode 513 may be composed of polysilicon or any other conducting material. While not illustrated, it is important to note that the gate electrode 513 may extend in a direction perpendicular to the plane of the cross-section in FIGS. 5A-5G, and may also extend vertically within the epitaxial/drift layer 503 and body layer 505 to facilitate the formation of external contacts. Another dielectric layer may be formed above the gate electrode 513 in order to provide insulation.

Figure 5F:
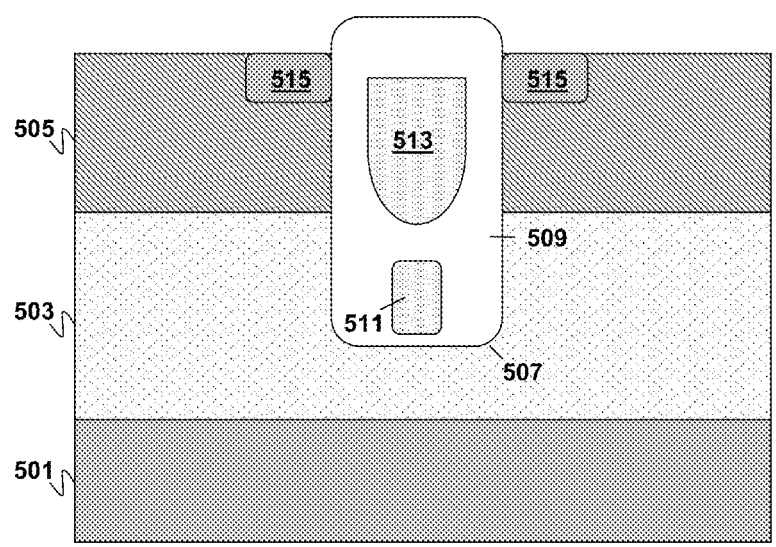
Figure 5G:
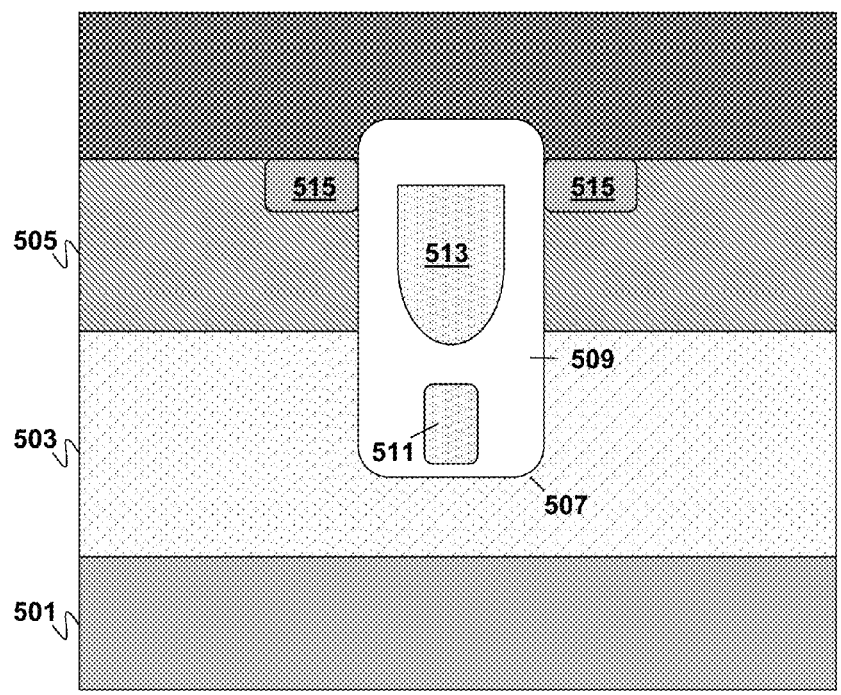

A masked implant (mask not shown) is then performed to form one or more source regions 515 of a first conductivity type as illustrated in FIG. 5F. By way of example, and not by way of limitation, the implant may be followed by diffusion to achieve the desired doping concentration. The source regions 515 are formed within a top surface of the body layer 505 adjacent the sidewalls of the trench 507. By way of example, and not by way of limitation, the source regions 515 may be n+ source regions for an n+ type substrate 501.

Metal pads may then be formed above the body layer 505 using a metal mask (not shown) to provide external contacts to the source regions 515, gate electrode 513, and shield electrode 511. Please refer to both FIG. 5G and FIG. 5H in order to observe a cross-sectional view and a top-view, respectively, of the shielded gate trench MOSFET device 500. A source pad 517 provides an external contact to the source regions 515 of the MOSFET device 500. The source pad 517 is insulated from the shield electrode 511 and gate electrode 513. A gate pad 519 provides an external contact to the gate electrode 513. The gate pad 519 is insulated from the shield electrode 511 and source regions 515. A shield pad 521 provides an external contact to the shield electrode 511. The shield pad 521 is insulated from the gate electrode 513 and source regions 515.

Figure 5H:
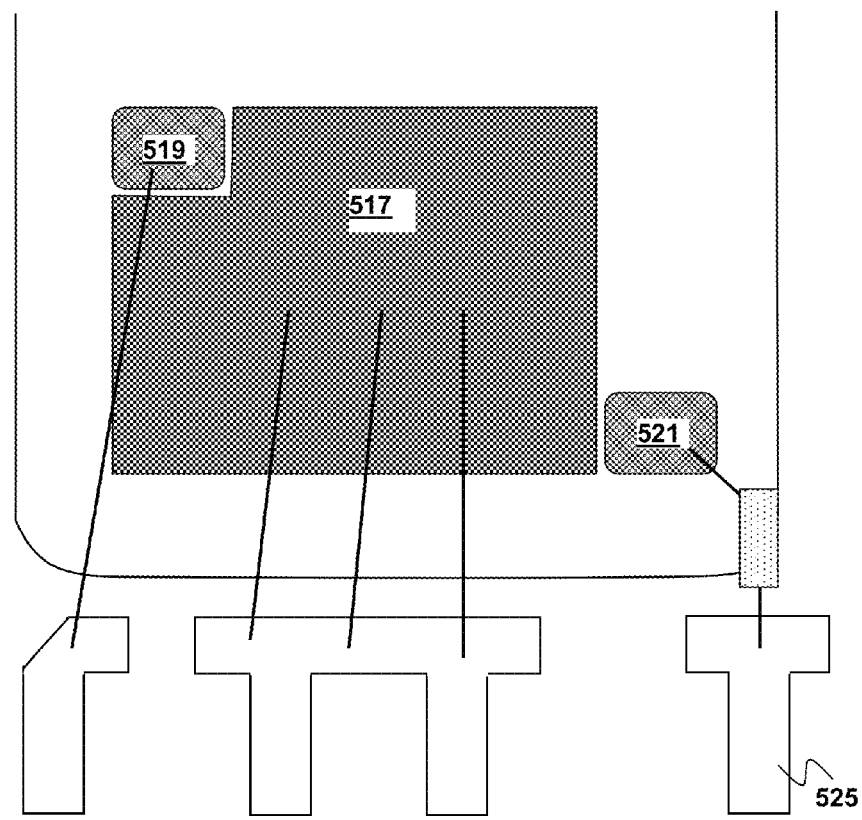

An external resistive element 523 may then be connected between the shield pad 521 and the source lead 525 of a lead frame in the package in order to improve device reverse recovery behavior as illustrated in FIG. 5H. By way of example, and not by way of limitation, the external resistive element 523 may be implemented as a simple external resistor, a metal layer wherein the resistivity is distributed throughout the entire metal layer, or a doped polysilicon layer wherein the resistivity is distributed throughout the entire doped polysilicon layer as discussed above.

While not illustrated above, the shielded gate trench MOSFET device 500 may additionally include an internal resistance between the shield electrode 511 and shield lead 525. By way of example, and not by way of limitation, the internal resistance may be implemented using polysilicon forming the gate electrode 513. Also by way of example, and not by way of limitation, the internal resistance may be implemented using polysilicon forming the shield electrode 511. One ordinarily skilled in the art will recognize that this fabrication method may be easily extended to include an internal resistive element by including additional standard processing steps.

Figure 6:
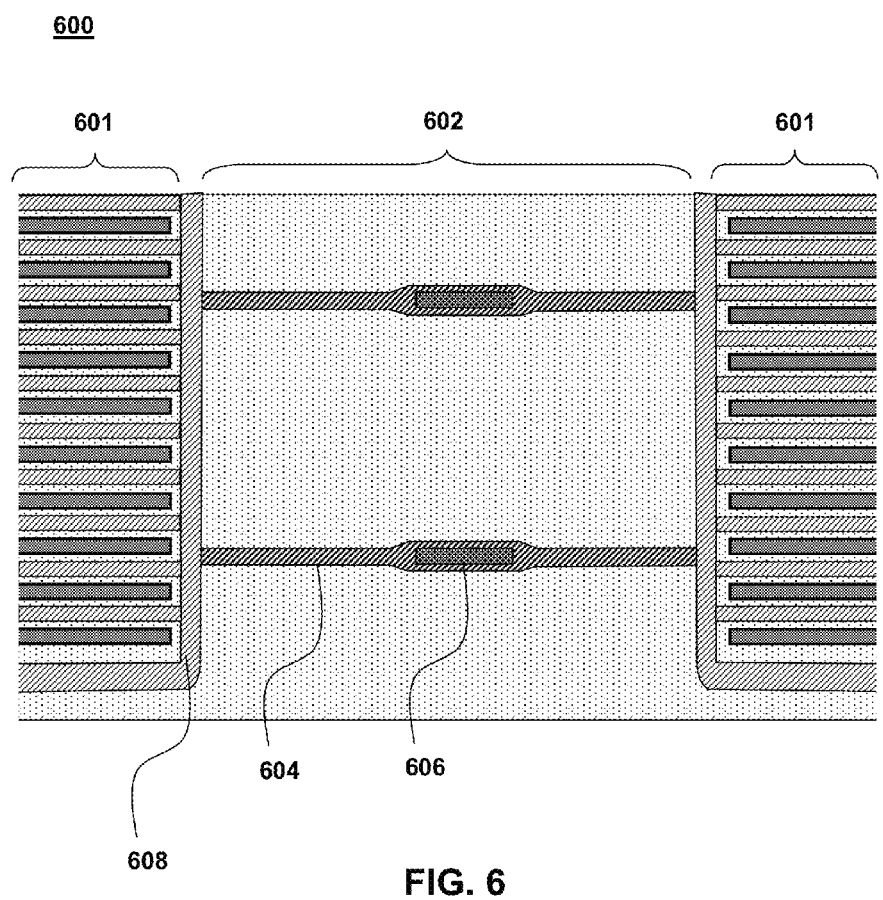
FIG. 6 is a layout top view of a shielded gate trench MOSFET device with the internal resistor formed in the shielded electrode between two active sections.

According to another embodiment of the present invention, an internal resistance may be formed in the shield electrode pickup trenches located between two active regions as shown in FIG. 6, which is a layout top view of a shielded gate trench MOSFET 600. In this figure, a shield electrode connection region 602 is located between two active regions 601. Shield electrode pickup trenches 604 with each shield electrode pickup contact 606 formed inside each trench 604. The lump resistance may be implemented using heavily doped polysilicon to fill the shield electrode pickup trenches 604. The lump resistance is therefore located outside of the termination trench 608 around one or more of the two active regions 601. The resistor value is determined by length and/or width of the shield electrode pickup trenches and is adjustable by modifying the number of contacts. The contact in the shield electrode pickups can be selectively chosen, so that the number of shield electrode pickups can be set to meet the desired lumped resistance target. Forming the internal resistance in the shield electrode pickup trenches does not require any additional masking and process steps.

Figure 7:
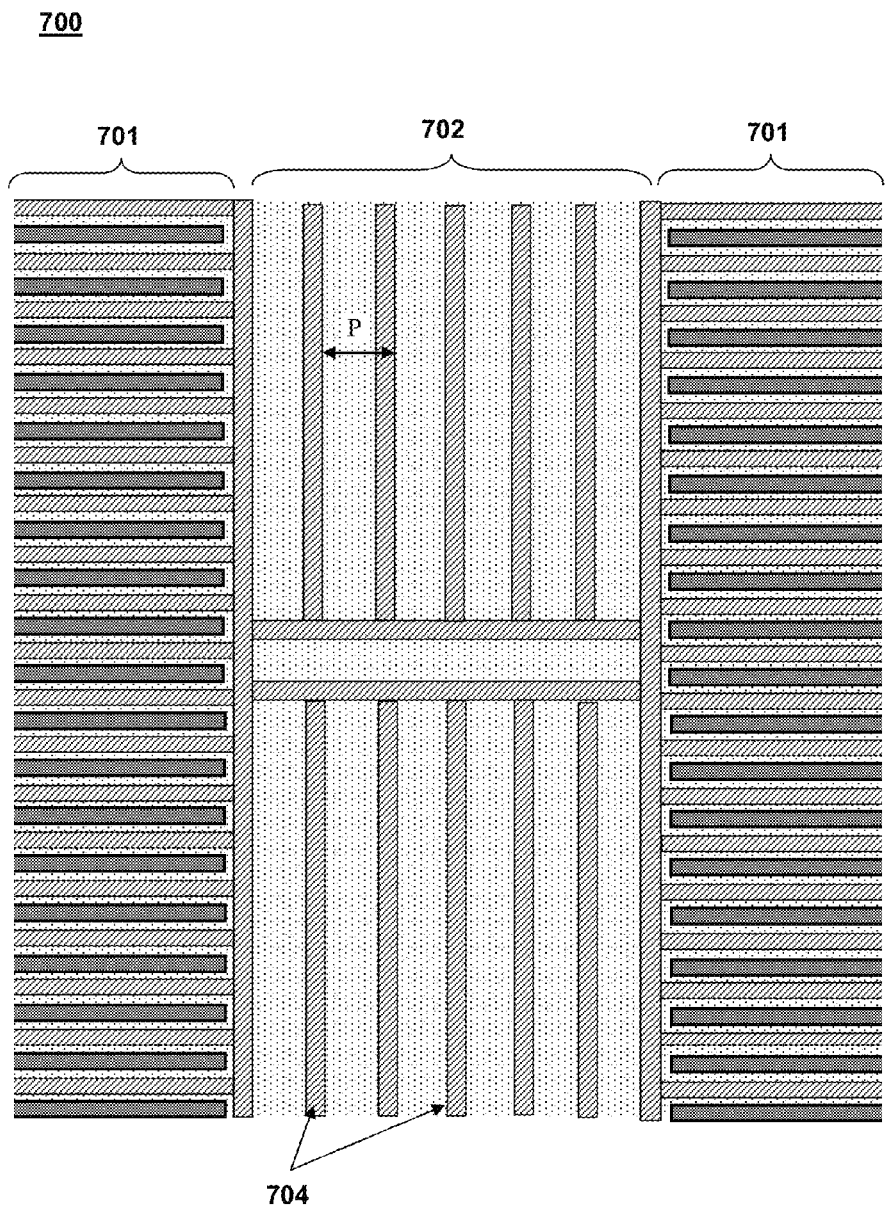
FIG. 7 is a layout top view of a shielded gate trench MOSFET device with the internal resistor formed in the shielded electrode pick up region, where Breakdown voltage (BV) is determined by pitch.

FIG. 7 is a layout top view of a shielded gate trench MOSFET 700 according to an alternative embodiment of FIG. 6. As shown in this figure, a lump resistor may be formed in the shielded electrode pickup region, where the Breakdown voltage is determined by the trench pitch. The shield electrode pickup region can be put in the center of the die or at the edge of the die in the layout. As shown in this figure, a shield electrode connection region 702 is located between two active regions 701. The lump resistance may be implemented using heavily doped polysilicon to fill the shield electrode pickup trenches 704. In this embodiment, the shield electrode pickup contact is formed inside a termination region around one or more of the two active regions 701 (not shown). Forming the internal resistance in the shield electrode pickup trenches does not require any additional masking and process steps.

While the above is a complete description of the preferred embodiments of the present invention, it is possible to use various alternatives, modifications, and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for". Any element in a claim that does not explicitly state "means for" performing a specified function, is not to be interpreted as a "means" or "step" clause as specified in 35 USC §112, ¶6.

What is claimed is:

1. A shielded gate field effect transistor comprising:
   first and second active transistor regions;
   a shield electrode connection region located between two active transistor regions, wherein the shield electrode connection region includes a plurality of shield electrode pickup trenches with each shield electrode pickup trench having a shield electrode contact formed therein and wherein the shield electrode contact is electrically isolated from source regions at the first and second active transistor regions; and
   a shield electrode electrically connected to the shield electrode connection region.

2. The transistor of claim 1, wherein at least one of the plurality of shield electrode pickup trench is filled with heavily doped polysilicon.

3. A method for manufacturing a shielded gate trench field effect transistor, comprising:
   a) providing an epitaxial layer of a first conductivity type on top of a substrate of a first conductivity type;
   b) providing a body layer of a second conductivity type above the epitaxial layer;
   c) providing a trench within the body layer and epitaxial layer, wherein the trench is lined with a dielectric layer;
   d) providing a shield electrode within a lower portion of the trench, wherein the shield electrode is insulated from the epitaxial layer by the dielectric layer;
   e) providing a gate electrode within the trench above the shield electrode, wherein the gate electrode is insulated from the shield electrode by an additional dielectric layer;
   f) providing one or more source regions of a fourth conductivity type within a top surface of the body layer, wherein each source region is adjacent a sidewall of the trench;
   g) providing a source pad above the body layer, wherein the source pad is electrically connected to the one or more source regions and insulated from the gate electrode and shield electrode, the source pad providing an external contact to the source region;
   h) providing a gate pad above the body layer, wherein the gate pad is electrically connected to the gate electrode and insulated from the one or more source regions and the shield electrode, the gate pad providing an external contact to the gate electrode; and
   i) providing a shield pad above the body layer, wherein the shield pad is electrically connected to the shield electrode and insulated from the one or more source regions and the gate electrode, the shield pad providing an external contact to the shield electrode.

4. The method of claim 3, further comprising providing a resistive element between the shield pad and a source lead that is electrically connected to the one or more source regions.

5. The method of claim 4, wherein providing the resistive element between the shield pad and the source lead includes placing a lumped resistive element between the shield pad and a source lead in a package.

6. The method of claim 5, wherein the lumped resistive element is an external resistive element.

7. The method of claim 6, wherein the external resistive element is a metal layer.

8. The method of claim 6, wherein the external resistive element is a polysilicon layer.

9. The method of claim 3, further comprising forming an internal resistive element between the shield electrode and the shield pad.

10. The method of claim 9, wherein the internal resistive element is a lumped resistor comprising polysilicon found within the shield electrode.

11. The method of claim 9, wherein the internal resistive element is a lumped resistor comprising polysilicon found within the gate electrode.

12. The method of claim 3, wherein the shield electrode is electrically connected to a shield electrode connection region located between two active regions, wherein the shield electrode connection region includes a plurality of shield electrode pickup trenches with each shield electrode pickup trench having a shield electrode contact formed therein.

13. The method of claim 12, wherein the lump resistance is implemented using heavily doped polysilicon to fill the shield electrode pickup trenches.

14. The method of claim 12, wherein the lumped resistance is located outside of a termination trench around one or more of the two active regions.

15. The method of claim 12, wherein the shield electrode pickup contacts are formed inside a termination region around one or more of the two active regions.

16. The method of claim 12 wherein a resistance value of the lumped resistance is determined by a length and/or width of the shield electrode pickup trenches and is adjustable by modifying the number of contacts.

17. The method of claim 12, wherein a number of shield electrode pickups trenches is selected to meet a desired lumped resistance target.

* * * * *